United States Patent [19]

Cho et al.

[11] Patent Number: 4,959,814
[45] Date of Patent: Sep. 25, 1990

[54] SENSING DETECTION CIRCUIT IN DYNAMIC RANDOM ACCESS MEMORY

[75] Inventors: Soo I. Cho, Seoul; Si D. Choi, Suwon, both of Rep. of Korea

[73] Assignee: Samsung Electronics Co., Ltd., Suwon, Rep. of Korea

[21] Appl. No.: 290,991

[22] Filed: Dec. 28, 1988

[30] Foreign Application Priority Data

Mar. 17, 1988 [KR] Rep. of Korea .................. 88-2801

[51] Int. Cl.[5] .............................................. G11C 7/00
[52] U.S. Cl. .................................... 365/207; 365/149; 365/233
[58] Field of Search ............... 365/189.01, 189.05, 365/205, 207, 208, 149, 233

[56] References Cited

U.S. PATENT DOCUMENTS

| 4,748,596 | 5/1988 | Ogura et al. | 365/205 |
| 4,780,850 | 10/1988 | Miyamoto et al. | 365/205 X |
| 4,829,483 | 5/1989 | Ogihara | 365/205 X |

Primary Examiner—Joseph A. Popek
Attorney, Agent, or Firm—Ladas & Parry

[57] ABSTRACT

A sensing detection circuit in a DRAM detects the sensing of data in a memory array. The circuit reduces the sensing access time significantly by detecting an output produced upon completion of the data sensing in the memory array which output is used to immediately initiate the next date operation without unnecessary delay.

4 Claims, 3 Drawing Sheets

4,959,814

SENSING DETECTION CIRCUIT IN DYNAMIC RANDOM ACCESS MEMORY

BACKGROUND OF THE INVENTION

1. Field of the Invention

The present invention relates to a sensing detection circuit in a dynamic random access memory (DRAM) for minimizing the sensing access time in the DRAM.

2. Description of the Prior Art

FIG. 1 shows a typical memory array 1 with its associated circuit comprising a first clock signal generator CG1, a sensing clock signal generator SCG, a delay block DB and a second clock signal generator CG2.

The first clock signal generator CG1 is operative to receive an input, for example $\overline{RAS}$ or $\overline{RAS}$ and $\overline{CAS}$ for generating clock signals which operate the sensing clock signal generator SCG. The thus produced sensing signal S1 from the sensing clock signal generator SCG is applied to the memory array 1 for the sensing of bit lines sharing stored cell data in the DRAM.

To secure enough sensing time, the delay block DB has been used to delay the next clock signal from the second clock signal generator CG2 which increases the access time.

SUMMARY OF THE INVENTION

It is an object of the present invention to provide a sensing detection circuit in DRAMs which detects the sensing of data in the memory array to significantly reduce the sensing access time by detecting a sensing output produced upon completion of the data sensing in the memory array for immediately generating the next clock signal.

The above object may be effected according to the present invention by providing a circuit comprising a first clock signal generator responsive to an input signal for generating a first clock signal, a sensing clock signal generator controlled by the first clock signal generator to supply a sensing signal to the memory array to cause a sensing of the data in the array, a sensing detector for detecting an output signal produced from the data sensing of the memory array, and a second clock signal generator controlled by the output of the sensing detector.

Other objects and advantages will become apparent during the following description of the presently preferred embodiment of the invention taken in conjunction with the drawings.

DESCRIPTION OF THE PREFERRED EMBODIMENT

Figure 1:
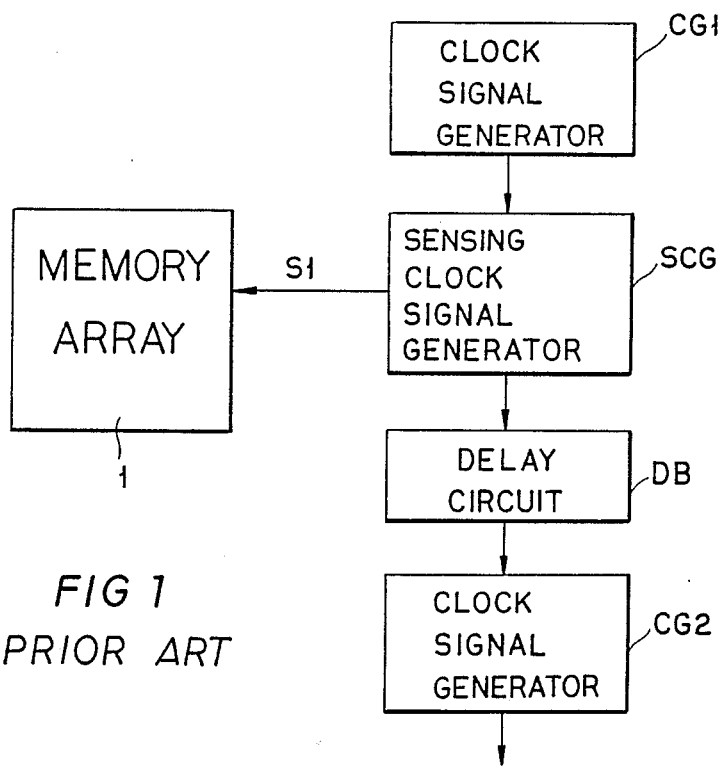
FIG. 1 shows a prior dynamic random access memory (DRAM) with its associated circuits.

First, the operation of a prior known DRAM memory will be described with reference to FIG. 1 in conjunction with FIG. 3. For the operation of the DRAM memory, clock signals are sequentially generated to select a word line so that charge sharing may be effected between the bit lines and the cells having data stored therein. When the sensing clock signal from the sensing clock signal generator SCG causes sensing of a pair of bit lines BL and $\overline{BL}$, enough sensing time must be available for the proper operation of the DRAM. To provide enough sensing time, a delay circuit DB has been used between the sensing clock signal generator SCG and a second clock signal generator CG2 for generating clock signals required for the next operation.

The present invention reduces the access time in DRAMs by replacing the conventional delay circuit with a sensing detector SD (FIG. 2) which detects the sensing operation in a memory array 1 and causes generation, without delay, of the clock signals for the next operation.

Figure 5:
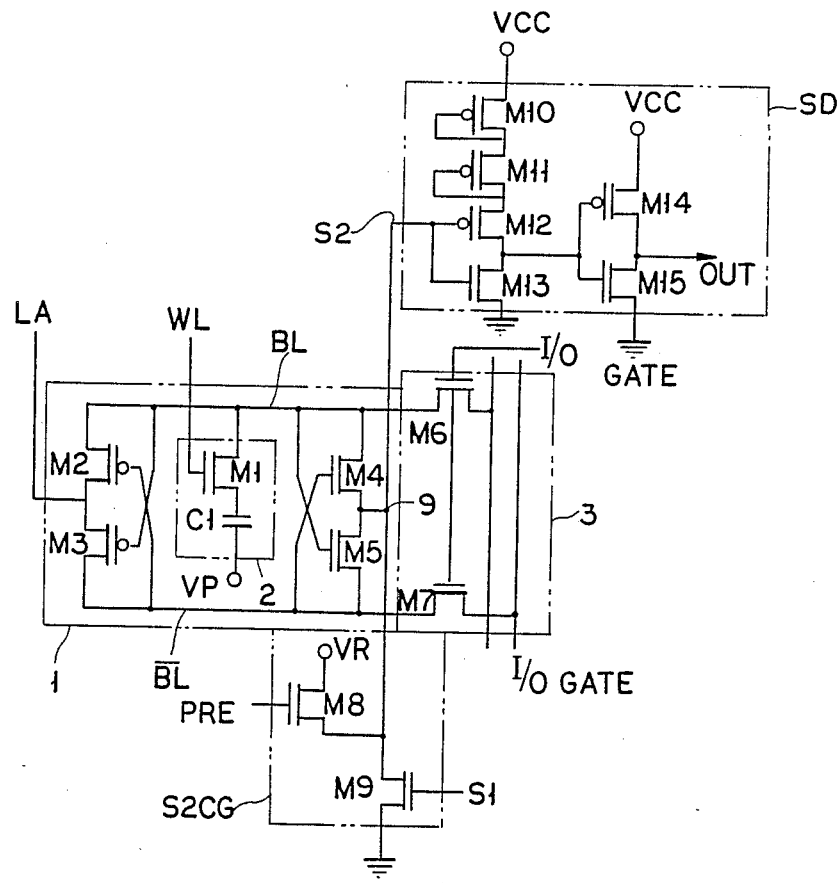
FIG. 5 is a circuit diagram of one embodiment of the present invention.

An embodiment of the present invention is shown in FIG. 5, wherein the memory array 1 is shown comprised of a memory cell 2 comprising an N type MOS transistor M1 and a capacitor C1, and P type MOS transistors M2 and M3 and N type MOS transistors M4 and M5 which are operated by the signal on the bit lines BL and $\overline{BL}$. A latch restore signal LA is applied to a node between the P type MOS transistors M2 and M3 while a word line signal WL is applied to the N type MOS transistor M1. The memory array 1 further includes an input-output (I/O) gate 3, including N type MOS transistors M6 and M7, and a S2 clock signal generator S2CG connected to a node 9 between the N type MOS transistors M4 and M5. The S2 clock signal generator S2CG is comprised of an N type MOS transistor M9 operated by a sensing signal S1 from the sensing clock signal generator SCG and an N type MOS transistor M8 to which a clock signal PRE is applied at a high level during the wait condition. The sensing detector SD is connected to the node 9 between the N type MOS transistors M4 and M5.

Figure 2:
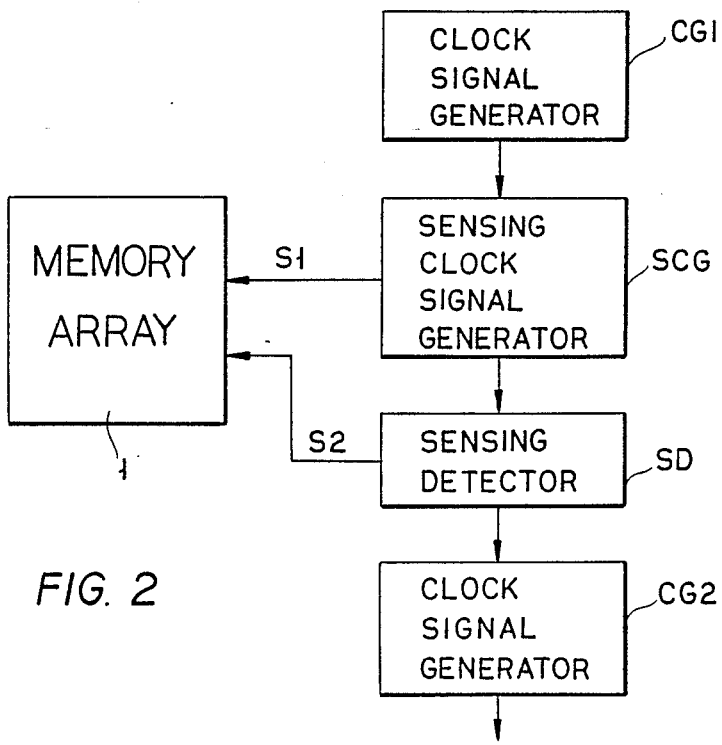
FIG. 2 is a block diagram of a DRAM having a sensing detector according to the present invention.
Figure 4:
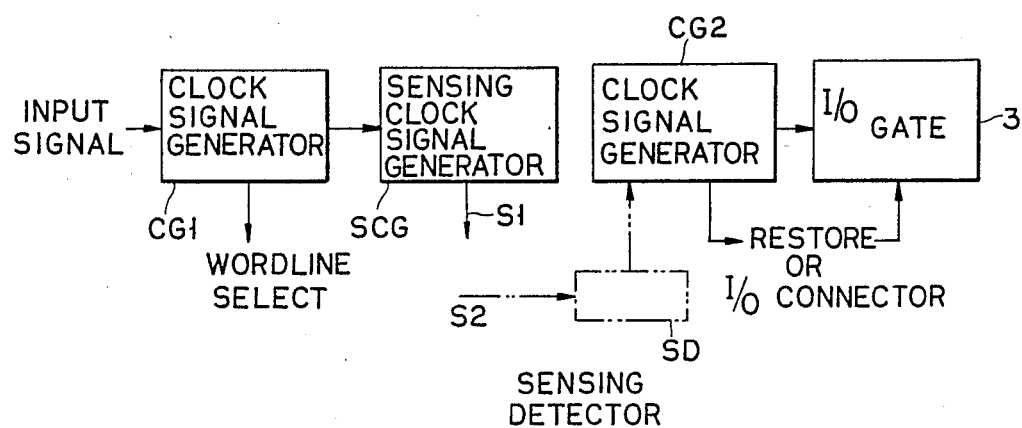
FIG. 4 illustrates the active operation of the DRAM of FIG. 2.

The sensing detector SD is comprised of P type MOS transistors M10 and M11 for supplying the source voltage $V_{cc}$, a P type MOS transistor M12 driven by a sensing output signal S2, an N type MOS transistor M13, and P and N type MOS transistors M14 and M15 connected to an output terminal OUT, whereby a low level signal is produced at the output terminal OUT when a sensing of the memory array 1 is detected. As shown in FIGS. 2 and 4, the output of the sensing detector is applied to the clock signal generator CG2.

In the operation of the memory array 1, when the signal on the word line WL turns the N type MOS transistor M1 on, the capacitor C1 is charged or discharged by a bit line BL through M1. As the P type MOS transistors M2 and M3 and the N type MOS transistors M4 and M5 are sequentially controlled by the output of the capacitor C1, a sensing of the memory array data is performed according to the voltage levels reached by the bit lines BL and $\overline{BL}$.

Figure 3:
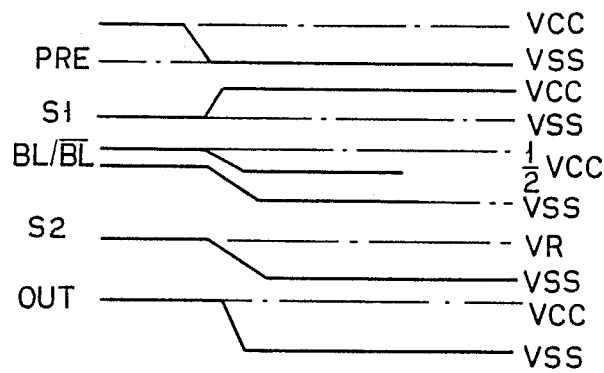
FIG. 3 is a timing chart illustrating the operation of the DRAM of FIG. 2.

Therefore, when the memory array 1 produces its output on the bit lines BL and $\overline{BL}$ as shown in FIG. 3, the bit line BL or $\overline{BL}$ becomes low so that a sensing signal S2 at low level is applied to the gate of the N type MOS transistor M13 in the sensing detector SD. Then the N type MOS transistor M13 and thus the P type MOS transistor M14 are turned off and a low level signal appears at the output terminal OUT which represents a completion of the sensing of the data in the memory array thereby causing the clock signal generator CG2 to generate, without unnecessary delay, the next clock signal for next operation When the sensing operation is not carried out, a sensing signal S2 at high level is applied to the gate of the N type MOS transistor M13. Then the N type MOS transistor M13 and thus the P type MOS transistor M14 are turned on and a high level signal appears at the output terminal OUT.

According to the sensing detection circuit of the present invention, the sensing access time for the data in a memory array may be reduced significantly over conventional delay circuit means while tolerating the changes in sensing time due to voltage source variations.

The invention is in no way limited to the example described hereinabove. Various modifications of the disclosed embodiment, as well as other embodiments of the invention, will become apparent to persons skilled in the art upon reference to the herein description of the invention. It is therefore contemplated that the appended claims will cover any such modifications or embodiments as fall within the true scope of the invention.

What is claimed is:

1. A sensing detection circuit for a memory comprising:
   a first clock signal generator (CG1) responsive to an input signal for generating a clock signal;
   a sensing clock signal generator (SCG) controlled by said first clock signal generator (CG1) for supplying a sensing signal (S1) to a memory array (1);
   a sensing detector (SD) for detecting a first output signal (S2) from said memory array signifying the completion of the sensing of data from said memory array (1) and generating, in response to said first output signal, a second output signal (OUT) and;
   a second clock signal generator (CG2) responsive to said second output signal from said sensing detector (SD) for generating a successive clock signal.

2. A sensing detection circuit according to claim 1, wherein said memory array (1) includes a pair of bit lines (BL and $\overline{BL}$) and a memory cell (2) including a transistor (M1) and a capacitor (C1) operated by a work line select signal, the voltage level of said bit lines (BL and $\overline{BL}$) being changed by charging and discharging the capacitor (C1) through the transistor (M1) for generating said first output signal (S2).

3. A sensing detection circuit according to claim 2, wherein said memory array (1) further includes a pair of series connected P type MOS transistors (M2 and M3) and a pair of series connected N type MOS transistors (M4 and M5) each pair of which is connected between said pair of bit lines, a first node between said P type transistors being connected to a latch restore signal (LA), and the output signal of a third clock signal generator (S2CG) being connected to a second node between said N type transistors, and said first output signal being generated at said second node in response to the operation of said pairs of transistors under the control of said bit lines.

4. A sensing detection circuit according to claim 1, wherein said sensing detector (SD) includes P type MOS transistors (M10 and M11) for supplying a source of voltage (Vcc), P and N type MOS transistors (M12 and M13) for receiving said first output signal (S2), and P and N type MOS transistors (M14 and M15) for providing said second output signal.

* * * * *